(12) United States Patent
Kong et al.

(10) Patent No.: US 12,364,100 B2
(45) Date of Patent: Jul. 15, 2025

(54) DISPLAY DEVICE

(71) Applicant: LG Display Co., Ltd., Seoul (KR)

(72) Inventors: Jin-Young Kong, Paju-si (KR); Min-Kyu Choi, Paju-si (KR); Yoon-Mo Nam, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 444 days.

(21) Appl. No.: 17/556,740

(22) Filed: Dec. 20, 2021

(65) Prior Publication Data

US 2022/0209168 A1    Jun. 30, 2022

(30) Foreign Application Priority Data

Dec. 29, 2020 (KR) .................. 10-2020-0186111

(51) Int. Cl.
| | |
|---|---|
| *H10K 59/12* | (2023.01) |
| *H01L 25/18* | (2023.01) |
| *H05K 1/18* | (2006.01) |
| *H10K 50/844* | (2023.01) |
| *H10K 50/87* | (2023.01) |
| *H10K 59/80* | (2023.01) |
| *H10K 59/122* | (2023.01) |
| *H10K 59/131* | (2023.01) |

(52) U.S. Cl.
CPC ............. *H10K 59/12* (2023.02); *H01L 25/18* (2013.01); *H10K 50/844* (2023.02); *H10K 50/87* (2023.02); *H10K 59/8794* (2023.02); *H05K 1/189* (2013.01); *H05K 2201/10128* (2013.01); *H10K 59/122* (2023.02); *H10K 59/131* (2023.02)

(58) Field of Classification Search
CPC ....... H01L 25/18; H01L 23/60; H01L 25/167; H10K 50/87; H10K 59/122; H10K 59/8794; H10K 59/131; H10K 59/12; H10K 59/129; H10K 50/84; H05K 2201/10136; H05K 1/189; H05K 7/20954; H05K 7/20963; H05K 1/0209; H05K 3/0061
See application file for complete search history.

(56) References Cited

U.S. PATENT DOCUMENTS

| | | | |
|---|---|---|---|
| 7,710,045 B2* | 5/2010 | Schultz ................ | H05K 1/0373 315/246 |
| 2006/0083901 A1* | 4/2006 | Cho ........................... | C09J 7/10 428/188 |
| 2016/0044802 A1* | 2/2016 | Kim ........................ | H04N 5/64 361/679.01 |
| 2016/0073528 A1* | 3/2016 | Park .................... | H10K 59/8794 361/752 |
| 2019/0116405 A1* | 4/2019 | Noh ...................... | G06F 1/1626 |

(Continued)

FOREIGN PATENT DOCUMENTS

| | | |
|---|---|---|
| KR | 10-0610633 B1 | 8/2006 |
| KR | 10-0917777 B1 | 9/2009 |

(Continued)

*Primary Examiner* — Adam B Dravininkas
(74) *Attorney, Agent, or Firm* — Birch, Stewart, Kolasch & Birch, LLP

(57) ABSTRACT

Discussed is a display device including a display panel, a heat dissipation plate having a top surface attached to a first surface of the display panel, and an adhesive layer between the display panel and the heat dissipation plate. The adhesive layer has a plurality of embossed patterns at a surface on the display panel side.

21 Claims, 4 Drawing Sheets

(56) References Cited

U.S. PATENT DOCUMENTS

| | | | | |
|---|---|---|---|---|
| 2019/0281146 A1* | 9/2019 | Jang | ........................ | H01Q 21/06 |
| 2020/0020759 A1* | 1/2020 | Song | .................... | H04M 1/0269 |
| 2020/0042133 A1* | 2/2020 | Park | ....................... | G06F 1/1684 |
| 2020/0058712 A1* | 2/2020 | Lee | ......................... | H10K 59/40 |

FOREIGN PATENT DOCUMENTS

| | | | |
|---|---|---|---|
| KR | 10-2013-0010764 | A | 1/2013 |
| KR | 10-1317236 | B1 | 10/2013 |
| KR | 10-2014-0020441 | A | 2/2014 |
| KR | 10-2015-0096876 | A | 8/2015 |
| KR | 10-2019-0041563 | A | 4/2019 |
| KR | 10-2020-0007110 | A | 1/2020 |

\* cited by examiner

DISPLAY DEVICE

CROSS REFERENCE TO RELATED APPLICATION

This application claims priority to Korean Patent Application No. 10-2020-0186111 filed in the Republic of Korea on Dec. 29, 2020, the entire contents of which are hereby expressly incorporated by reference in its entirety into the present application.

BACKGROUND

Field of the Disclosure

The present disclosure relates to a display device, and more particularly, to a display device with a heat dissipation member.

Description of the Background

With entering into a full-fledged information age, there is a growing interest in information displays dealing with and displaying mass information. In response to this, various display devices with advantages of a thin thickness, light weight and low power consumption have been developed and have been in the spotlight.

Among the various flat panel display devices, an organic light emitting diode display device can be lightweight and thin because it is self-luminous and does not require a backlight unit used for a liquid crystal display device which is a nonluminous device. Further, organic light emitting diode display device can have advantages in power consumption.

The organic light emitting diode display device can be driven by low voltages of direct current (DC) and can have a fast response time. Further, the organic light emitting diode display device can be strong against the external impacts and can be used in a wide range of temperatures because its components are solids. In addition, the organic light emitting diode display device can be manufactured at relatively low costs.

The organic light emitting diode display device is widely applied to electronic devices such as monitors of computers or televisions as well as portable electronic devices such as smart phones or tablet PCs to provide various types of information in various ways.

By the way, the organic light emitting diode display device can also generate heat when emitting light. The heat may degrade the organic light emitting diode and can cause an afterimage, so that there can be a limitation that the image quality may be lowered. Particularly, as the display device has a larger size and higher resolution, more light can be generated, and the heat generated accordingly can increase.

Accordingly, there is a need for a heat dissipation member for quickly discharging the heat inside the organic light emitting diode display device to the outside.

SUMMARY OF THE DISCLOSURE

Accordingly, the present disclosure is directed to a display device that substantially obviates one or more of the problems due to limitations and disadvantages of the related art.

In addition, the present disclosure is to provide an improved display device with a heat dissipation member.

Additional features and aspects will be set forth in the description which follows, and in part will be apparent from the description, or can be learned by practice of the inventive concepts provided herein. Other features and aspects of the inventive concepts can be realized and attained by the structure particularly pointed out in the written description, or derivable therefrom, and claims hereof as well as the appended drawings.

To achieve these and other aspects of the inventive concepts, as embodied and broadly described herein, a display device includes a display panel, a heat dissipation plate having a top surface attached to a first surface of the display panel, and an adhesive layer between the display panel and the heat dissipation plate, wherein the adhesive layer has a plurality of embossed patterns at a surface on the display panel side.

As another aspect, a display device includes a display panel, a source printed circuit board disposed at a first surface of the display panel, a driver integrated circuit disposed at the first surface of the display panel and electrically connected to the display panel and the source printed circuit board, and a buffer member between the driver integrated circuit and the display panel and between the source printed circuit board and the display panel, wherein the buffer member has a protrusion corresponding to the driver integrated circuit, and wherein a distance between the driver integrated circuit and the display panel is greater than a distance between the source printed circuit board and the display panel.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain various principles of the present disclosure.

In the drawings.

DETAILED DESCRIPTION OF THE EMBODIMENTS

Reference will now be made in detail to an exemplary embodiment of the disclosure, examples of which are illustrated in the accompanying drawings.

Figure 1:
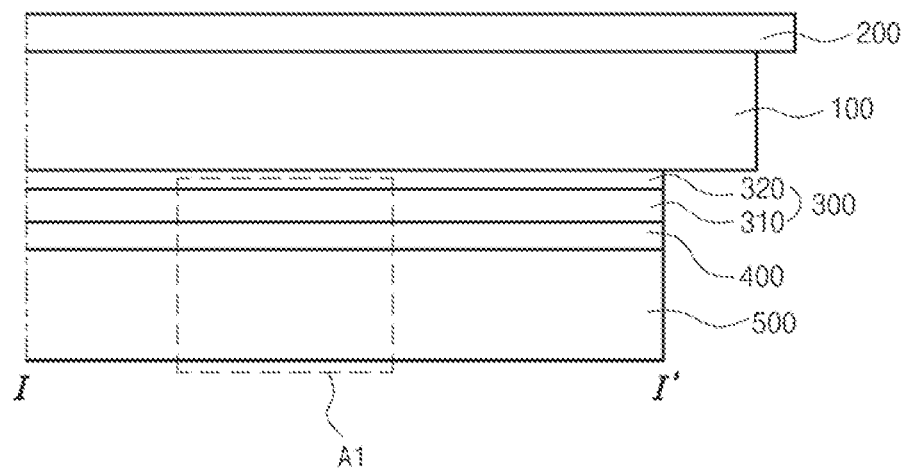
FIG. 1 is a cross-sectional view schematically illustrating a display device according to an embodiment of the present disclosure and is a cross-sectional view corresponding to the line I-I' of FIG. 6.
Figure 2:
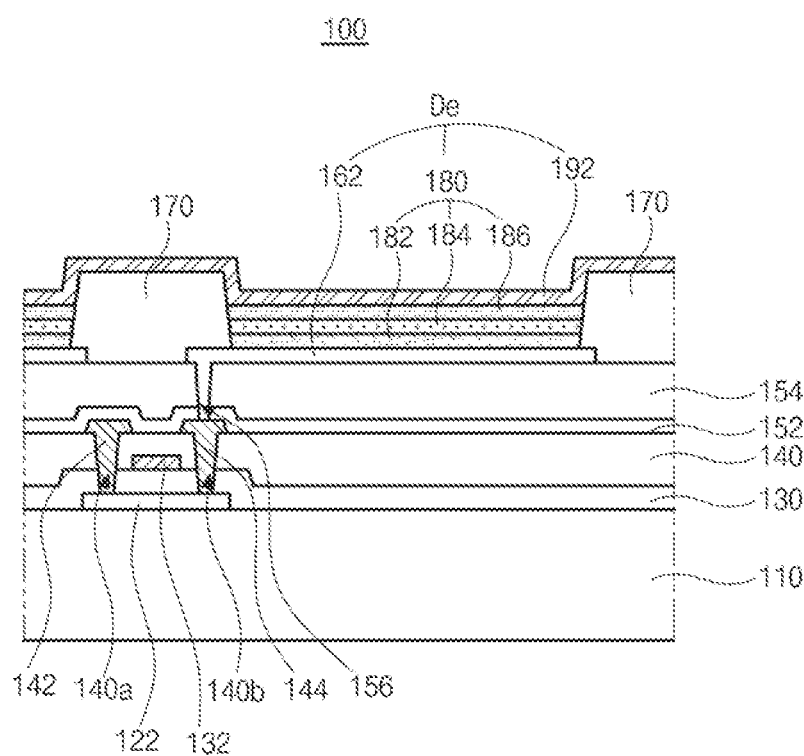
FIG. 2 is a cross-sectional view schematically illustrating an example of a display panel of the display device according to the embodiment of the present disclosure.

FIG. 1 is a cross-sectional view schematically illustrating a display device according to an embodiment of the present disclosure, and FIG. 2 is a cross-sectional view schematically illustrating an example of a display panel of the display device according to the embodiment of the present disclosure. All the components of each display device according to all embodiments of the present disclosure are operatively coupled and configured.

In FIG. 1 and FIG. 2, the display device according to the embodiment of the present disclosure includes a display panel 100, a polarizing plate 200, an encapsulation film 300, an adhesive layer 400, and a heat dissipation plate 500.

The display panel 100 can be an organic light emitting diode display panel shown in FIG. 2, and thus, the display device according to the embodiment of the present disclosure can be an organic light emitting diode display device.

Specifically, in the organic light emitting diode display panel 100 according to the embodiment of the present disclosure, a patterned semiconductor layer 122 is formed on an insulation substrate 110. The substrate 110 can be a glass substrate or a plastic substrate. The semiconductor layer 122 can be formed of an oxide semiconductor material. In this case, a light shielding pattern and a buffer layer can be further formed under the semiconductor layer 122. The light shielding pattern blocks light incident on the semiconductor layer 122 and prevents the semiconductor layer 122 from deteriorating due to the light. The buffer layer can be formed of an inorganic insulating material such as silicon oxide ($SiO_2$) or silicon nitride ($SiN_x$) and can be a single layer or a multiple layer. Alternatively, the semiconductor layer 122 can be formed of polycrystalline silicon, and in this case, both ends of the semiconductor layer 122 can be doped with impurities.

A gate insulation layer 130 of an insulating material is formed on the semiconductor layer 122 substantially all over the substrate 110. The gate insulation layer 130 can be formed of an inorganic insulating material such as silicon oxide ($SiO_2$). When the semiconductor layer 122 is formed of polycrystalline silicon, the gate insulation layer 130 can be formed of silicon oxide ($SiO_2$) or silicon nitride ($SiN_x$).

A gate electrode 132 of a conductive material such as metal is formed on the gate insulation layer 130 corresponding to a center of the semiconductor layer 122. In addition, a gate line and a first capacitor electrode can be formed on the gate insulation layer 130. The gate line extends in a first direction, and the first capacitor electrode is connected to the gate electrode 132.

For example, the gate electrode 132, the gate line and the first capacitor electrode can be formed of one or more of aluminum (Al), molybdenum (Mo), titanium (Ti), nickel (Ni), chromium (Cr), copper (Cu) and their alloys and can have a single-layered structure or a multiple-layered structure, but is not limited thereto.

Meanwhile, in the embodiment of the present disclosure, although the gate insulation layer 130 is formed substantially all over the substrate 110, the gate insulation layer 130 can be patterned to have the same shape as the gate electrode 132.

An interlayer insulation layer 140 of an insulating material is formed on the gate electrode 132 substantially all over the substrate 110. The interlayer insulation layer 140 can be formed of an inorganic insulating material such as silicon oxide ($SiO_2$) or silicon nitride ($SiN_x$) or an organic insulating material such as photo acryl or benzocyclobutene.

The interlayer insulation layer 140 has first and second contact holes 140a and 140b exposing top surfaces of the both ends of the semiconductor layer 122. The first and second contact holes 140a and 140b are disposed at both sides of the gate electrode 132 and are spaced apart from the gate electrode 132. Here, the first and second contact holes 140a and 140b are formed in the gate insulation layer 130. Alternatively, when the gate insulation layer 130 is patterned to have the same shape as the gate electrode 132, the first and second contact holes 140a and 140b are formed only in the interlayer insulation layer 140.

Source and drain electrodes 142 and 144 of a conductive material such as metal are formed on the interlayer insulation layer 140. In addition, a data line, a power line and a second capacitor electrode can be formed on the interlayer insulation layer 140.

For example, the source and drain electrodes 142 and 144, the data line, the power line and the second capacitor electrode can be formed of one or more of aluminum (Al), molybdenum (Mo), titanium (Ti), nickel (Ni), chromium (Cr), copper (Cu) and their alloys and can have a single-layered structure or a multiple-layered structure, but is not limited thereto.

The source and drain electrodes 142 and 144 are spaced apart from each other with the gate electrode 132 interposed therebetween. The source and drain electrodes 142 and 144 contact the both ends of the semiconductor layer 122 through the first and second contact holes 140a and 140b, respectively. The data line extends in a second direction and crosses the gate line to define each pixel region. The power line for supplying high potential voltage is spaced apart from the data line. The second capacitor electrode is connected to the drain electrode 144 and overlaps the first capacitor electrode to form a storage capacitor with the interlayer insulation layer 140 therebetween as a dielectric. Alternatively, the first capacitor electrode can be connected to the drain electrode 144, and the second capacitor electrode can be connected to the gate electrode 132.

The semiconductor layer 122, the gate electrode 132, and the source and drain electrodes 142 and 144 constitute a thin film transistor. Here, the thin film transistor can have a coplanar structure in which the gate electrode 132 and the source and drain electrodes 142 and 144 are disposed at one side of the semiconductor layer 122, for example, over the semiconductor layer 122, but is not limited thereto.

Alternatively, the thin film transistor can have an inverted staggered structure in which the gate electrode is disposed under the semiconductor layer and the source and drain electrodes are disposed over the semiconductor layer. In this case, the semiconductor layer can be formed of amorphous silicon.

Here, the thin film transistor corresponds to a driving thin film transistor of the organic light emitting diode display device, and a switching thin film transistor having the same structure as the driving thin film transistor is further formed to correspond to each pixel region on the substrate 110. The gate electrode 132 of the driving thin film transistor is connected to a drain electrode of the switching thin film transistor, and a source electrode 142 of the driving thin film transistor is connected to the power line. In addition, a gate electrode and a source electrode of the switching thin film transistor are connected to the gate line and the data line, respectively.

Meanwhile, one or more sensing thin film transistors having the same structure as the driving thin film transistor can be further formed in each pixel region on the substrate 110, but is not limited thereto.

A passivation layer 152 and an overcoat layer 154 of an insulating material are sequentially formed on the source and drain electrodes 142 and 144 substantially all over the substrate 110. The passivation layer 152 can be formed of an inorganic insulating material such as silicon oxide ($SiO_2$) or silicon nitride ($SiN_x$). The overcoat layer 154 can be formed of an organic insulating material such as photo acryl or benzocyclobutene. The overcoat layer 154 can have a flat top surface.

The passivation layer 152 and the overcoat layer 154 have a drain contact hole 156 exposing the drain electrode 144. Here, the drain contact hole 156 is shown as being formed directly over the second contact hole 140b. Alternatively, the drain contact hole 156 can be spaced apart from the second contact hole 140b.

One of the passivation layer 152 and the overcoat layer 154 can be omitted. For example, the passivation layer 152 of an inorganic insulating material can be omitted.

A first electrode 162 of a conductive material having a relatively high work function is formed on the overcoat layer 154. The first electrode 162 is formed in each pixel region and contacts the drain electrode 144 through the drain contact hole 156. For example, the first electrode 162 can be formed of a transparent conductive material such as indium tin oxide (ITO) or indium zinc oxide (IZO), but is not limited thereto.

A bank layer 170 of an insulating material is formed on the first electrode 162. The bank layer 170 is disposed between adjacent pixel regions. The bank layer 170 has an opening exposing a central portion of the first electrode 162 and overlaps and covers edges of the first electrode 162. Here, the bank layer 170 has a single-layered structure, but is not limited thereto.

Alternatively, the bank layer has a double-layered structure. For example, the bank layer can have a first bank and a second bank on the first bank. A width of the first bank can be wider than a width of the second bank. In this case, the first bank can be formed of an inorganic insulating material or organic insulating material having a hydrophilic property, and the second bank can be formed of an organic insulating material having a hydrophobic property.

A light-emitting layer 180 is formed on the first electrode 162 exposed by the opening of the bank layer 170. The light-emitting layer 180 includes a hole auxiliary layer 182, an emission material layer 184, and an electron auxiliary layer 186 sequentially disposed on the first electrode 162.

Here, the emission material layer 184 is shown as being disposed only in the opening of the bank layer 170. Alternatively, the emission material layer 184 can also be formed on the bank layer 170.

Each of the hole auxiliary layer 182, the emission material layer 184, and the electron auxiliary layer 186 can formed of an organic material and can be formed through a solution process. Thus, the process can be simplified and a display device with a large size and high resolution can be provided. A spin coating method, an ink jet printing method, or a screen printing method can be used as the solution process, but the present disclosure is not limited thereto and other variations are possible.

Alternatively, each of the hole auxiliary layer 182, the emission material layer 184, and the electron auxiliary layer 186 can be formed through a vacuum evaporation process, or the hole auxiliary layer 182, the emission material layer 184, and the electron auxiliary layer 186 can be formed through a mix of a solution process and a vacuum evaporation process.

Meanwhile, the electron auxiliary layer 186 can be formed of an inorganic material.

The hole auxiliary layer 182 can include at least one of a hole injecting layer (HIL) and a hole transporting layer (HTL), and the electron auxiliary layer 186 can include at least one of an electron injecting layer (EIL) and an electron transporting layer (ETL).

A second electrode 192 of a conductive material having a relatively low work function is formed on the electron auxiliary layer 186 substantially all over the substrate 110. The second electrode 192 can be formed of aluminum (Al), magnesium (Mg), silver (Ag), or an alloy thereof.

The first electrode 162, the light-emitting layer 180, and the second electrode 192 constitute a light emitting diode De. The first electrode 162 can serve as an anode, and the second electrode 192 can serve as a cathode, but is not limited thereto.

An encapsulation layer can be formed on the second electrode 192 to block moisture or oxygen introduced from the outside, thereby protecting the light emitting diode De. The encapsulation layer can include at least one inorganic insulation layer. Alternatively, the encapsulation layer can have a structure in which an inorganic insulation layer and an organic insulation layer are alternately stacked.

The organic light emitting diode display device according to the embodiment of the present disclosure can be a bottom emission type in which light emitted from the emission material layer 184 is output to the outside through the first electrode 162. In this case, the second electrode 192 acts as a reflector.

Referring to FIG. 1 again, the polarizing plate 200 is provided on the display panel 100. The polarizing plate 200 is attached to an emission surface of the display panel 100, for example, a surface through which an image displayed. As described above, when the organic light emitting diode display device according to the embodiment of the present disclosure is the bottom emission type, a surface on the substrate 110 side becomes the emission surface of the display panel 100. Accordingly, the polarizing plate 200 is attached to the bottom surface of the substrate 110 of the display panel 100, for example, the surface opposite to the top surface on which the light emitting diode De is formed.

The polarizing plate 200 can include a linear polarizer and a quarter wave plate and can be a circular polarizing plate 200 that changes linearly polarized light into circularly polarized light or circularly polarized light into linearly polarized light. The polarizing plate 200 can block the external light reflected by the display panel 100 from being output to the outside, thereby improving the contrast ratio.

Next, an encapsulation film 300 is provided under the display panel 100. The encapsulation film 300 blocks the moisture from the outside and prevents the damage of the light emitting diode De. The encapsulation film 300 is attached onto the second electrode 192 of the light emitting diode De of the display panel 100. At this time, the encapsulation film 300 can be in contact with the encapsulation layer on the second electrode 192.

The encapsulation film 300 includes a first film 310 and a second film 320, and the second film 320 is disposed between the display panel 100 and the first film 310.

The first film 310 can be a face seal type metal foil film. The second film 320 can be a face seal type pressure sensitive adhesive. For example, the first film 310 is attached to the display panel 100 through the second film 320.

Next, the heat dissipation plate 500 is disposed under the display panel 100 and attached to the display panel 100 through the adhesive layer 400. More particularly, the heat dissipation plate 500 is attached to the encapsulation film 300 under the display panel 100 through the adhesive layer 400.

The heat dissipation plate 500 serves to radiate heat generated in the display panel 100 to the outside. The heat dissipation plate 500 can be formed of a metal material having relatively high thermal conductivity and can have a thickness of about 0.3 mm to about 0.5 mm. For example, the heat dissipation plate 500 can be formed of aluminum (Al).

Meanwhile, the adhesive layer 400 can be a pressure sensitive adhesive (PSA). The adhesive layer 400 can have a thickness of about 0.05 mm to about 0.1 mm, beneficially, a thickness of about 0.05 mm to about 0.07 mm.

As describe above, in the embodiment of the present disclosure, the heat dissipation plate 500 is attached to one side of the display panel 100, so that the heat in the display panel 100 can be rapidly discharged into the outside. In this case, the heat dissipation plate 500 is attached to a substantially entire surface of the display panel 100 through the adhesive layer 400.

By the way, bubbles can be generated in the process of attaching the heat dissipation plate 500, and a closed system can be formed around the bubbles. The closed system prevents the dissipation of the heat generated in the display panel 100 to thereby generate local heat and cause reduction of the lifespan and afterimages of the display panel 100.

Accordingly, in the embodiment of the present disclosure, a plurality of embossed patterns at a surface of the adhesive layer 400 on the display panel 100 side is formed, thereby preventing or minimizing the bubble generation.

This will be described in detail with reference to FIG. 3.

Figure 3:
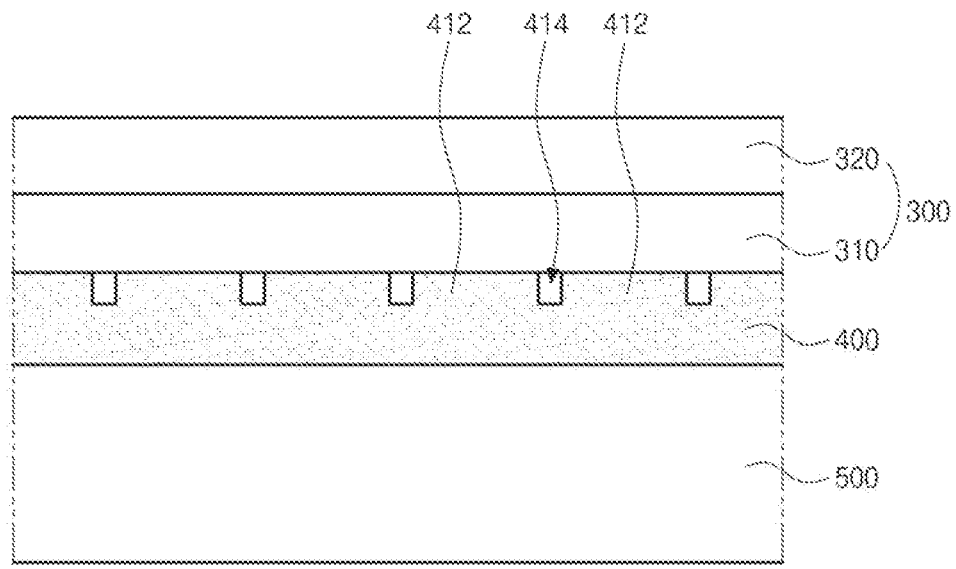
FIG. 3 is an enlarged view of an area A1 of FIG. 1.

FIG. 3 is an enlarged view of the area A1 of FIG. 1, and FIG. 1 and FIG. 3 are referenced together.

As shown in FIG. 3, the adhesive layer 400 has a plurality of embossed patterns 412 at one surface on the display panel 100 side, for example, the surface facing the display panel 100 and contacting the encapsulation film 300. Accordingly, the embossed patterns 412 are in contact with the encapsulation film 300. More particularly, the embossed patterns 412 are in contact with the first film 310 of the encapsulation film 300.

In this case, a valley 414 is formed between adjacent embossed patterns 412, and the adhesive layer 400 is partially separated from the encapsulation film 300 due to the valley 414. Namely, the adhesive layer 400 is partially separated from the first film 310 of the encapsulation film 300.

The valley 414 becomes a moving path of the bubbles when the heat dissipation plate 500 is attached to the display panel 100 through the adhesive layer 400. Accordingly, it is possible to suppress the bubble generation or decrease the size of the bubbles.

The adhesive layer 400 having the embossed patterns 412 will be described in detail with reference to FIG. 4 and FIG. 5.

Figure 4:
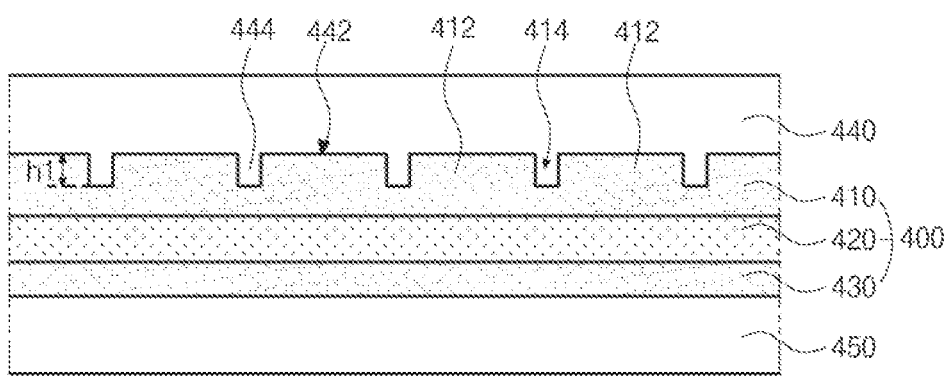
FIG. 4 is a schematic cross-sectional view of an adhesive layer according to the embodiment of the present disclosure.
Figure 5:
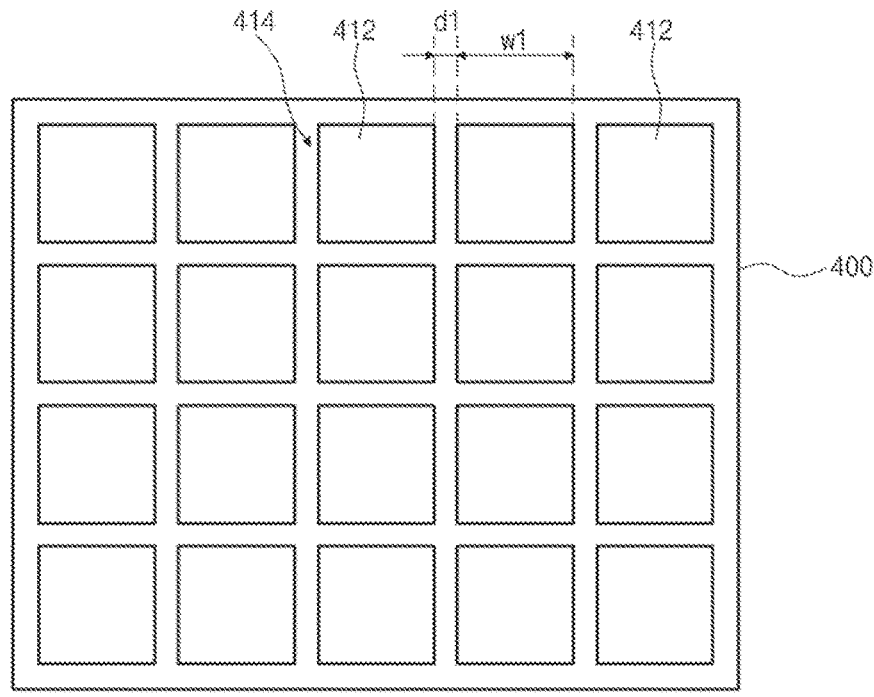
FIG. 5 is a schematic plan view of the adhesive layer according to the embodiment of the present disclosure.

FIG. 4 is a schematic cross-sectional view of an adhesive layer according to the embodiment of the present disclosure, and FIG. 5 is a schematic plan view of the adhesive layer according to the embodiment of the present disclosure. FIG. 1 and FIG. 3 are referenced together. Here, FIG. 5 shows the surface of the adhesive layer at which embossed patterns are formed.

As shown in FIG. 4 and FIG. 5, the adhesive layer 400 according to the embodiment of the present disclosure includes a first adhesive layer 410, a base layer 420, and a second adhesive layer 430, and the base layer 420 is disposed between the first and second adhesive layers 410 and 430.

For example, the first and second adhesive layers 410 and 430 can be formed of an acrylic adhesive, and the base layer 420 can be formed of polyethylene terephthalate (PET). However, the present disclosure is not limited thereto.

Here, a thickness of the base layer 420 can be greater than a thickness of the second adhesive layer 430 and smaller than a thickness of the first adhesive layer 410. For example, the thickness of the first adhesive layer 410 can be about 300 µm, the thickness of the base layer 420 can be about 25 µm, and the thickness of the second adhesive layer 430 can be about 15 µm, but is not limited thereto.

The adhesive layer 400 is supplied with first and second release papers 440 and 450 attached to both surfaces thereof. When the adhesive layer 400 is attached to the encapsulation film 300 and the heat dissipation plate 500, the first and second release papers 440 and 450 are removed. Here, the first release paper 440 is attached to the first adhesive layer 410, and the second release paper 450 is attached to the second adhesive layer 430.

For example, after removing the second release paper 450 and bonding the adhesive layer 400 to the heat dissipation plate 500, the first release paper 440 can be removed, and the adhesive layer attached to the heat dissipation plate 500 can be bonded to the display panel 100, more particularly, to the encapsulation film 300.

At this time, the first adhesive layer 410 bonded to the encapsulation film 300 on the display panel 100 side has the embossed patterns 412.

The first release paper 440 has concave portions 442 and convex portions 444 at a surface in contact with the first adhesive layer 410, and the embossed patterns 412 and the valleys 414 between the embossed patterns 412 are formed in the first adhesive layer 410 due to the concave portions 442 and the convex portions 444 of the first release paper 440. Here, the embossed patterns 412 of the first adhesive layer 410 correspond to the concave portions 442 of the first release paper 440, and the valleys 414 of the first adhesive layer 410 correspond to the convex portions 444 of the first release paper 440.

On the plane, each of the embossed patterns 412 can have a square shape, and the valleys 414 can form a lattice shape. However, the present disclosure is not limited thereto. Alternatively, each of the embossed patterns 412 can have a rectangular shape or other polygonal shape and can have the curved corners. In addition, each side of each of the embossed patterns 412 can be a straight line or a curved line. In a different way, each of the embossed patterns 412 can have a circular shape, an oval shape, or the like. Meanwhile, the shape of the valleys 414 can be changed depending on the shape of the embossed patterns 412.

The width w1 of the embossed pattern 412 is greater than the distance dl between the adjacent embossed patterns 412. In other words, the width w1 of the embossed pattern 412 is greater than the width dl of the valley 414. Further, the height h1 of the embossed pattern 412 can be smaller than the thickness of the first adhesive layer 410, and the height h1 of the embossed pattern 412 can be about 50% to about 70% of the thickness of the first adhesive layer 410. For example, the depth h1 of the valley 414 can be smaller than the thickness of the first adhesive layer 410, and the depth h1 of the valley 414 can be about 50% to about 70% of the thickness of the first adhesive layer 410.

For example, the width w1 of the embossed pattern 412 can be about 300 µm to about 400 µm, the distance dl between the adjacent embossed patterns 412, for example, the width dl of the valley 414 can be about 30 µm to about 45 µm, and the height h1 of the embossed pattern 412, for example, the depth h1 of the valley 414 can be about 15 µm to about 21 µm.

As described above, in the embodiment of the present disclosure, the plurality of embossed patterns 412 are provided at the surface of the adhesive layer 400 on the display panel 100 side in attaching the heat dissipation plate 500 to the substantially entire surface of the display panel 100 through the adhesive layer 400, thereby suppressing the bubble generation or minimizing the size of the bubbles. Namely, the size of the bubbles can be made smaller than about 15 mm even if the bubbles are generated.

Accordingly, the local heat and the afterimages can be prevented, so that the luminance and image quality can be improved and the lifespan of the display device can be increased.

In the previous embodiment, the bottom emission type display device has been described as an example, but the display device of the present disclosure can be a top emission type in which the light emitted from the emission material layer 184 is output to the outside through the second electrode 192. In this case, the first electrode 162 can further include a reflective layer formed of an opaque conductive material, and the second electrode 192 can have a relatively thin thickness such that light is transmitted therethrough or can be formed of a transparent conductive material.

In the top emission type display device, the surface on the second electrode 192 side becomes the emission surface. The polarizing plate 200 can be attached to the top surface of the second electrode 192 of the light emitting diode De, more particularly, to the encapsulation layer, and the heat dissipation plate 500 can be attached to the bottom surface of the substrate 110 of the display panel 100.

Meanwhile, the display device of the present disclosure includes a driving portion for driving the display panel 100, and the driving portion can be disposed on a rear surface of the display panel 100, for example, a rear surface of the heat dissipation plate 500. The display device of the present disclosure including the driving portion will be described with reference to FIG. 6 and FIG. 7.

Figure 6:
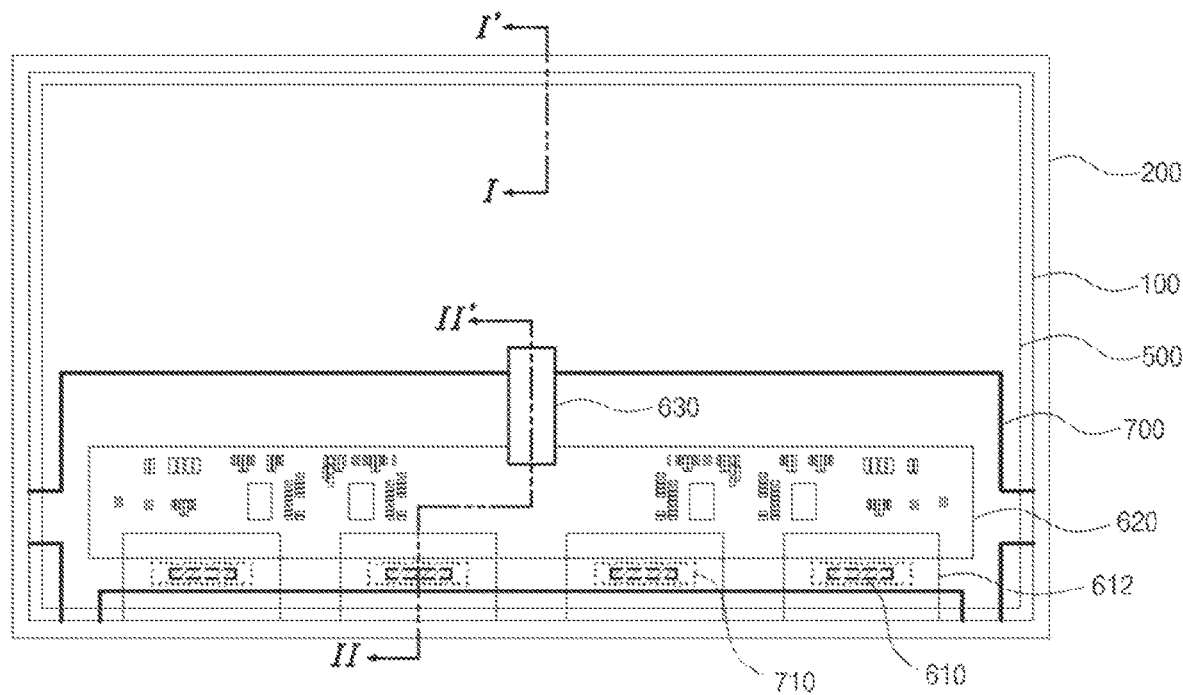
FIG. 6 is a schematic rear view of a display device according to the embodiment of the present disclosure.
Figure 7:
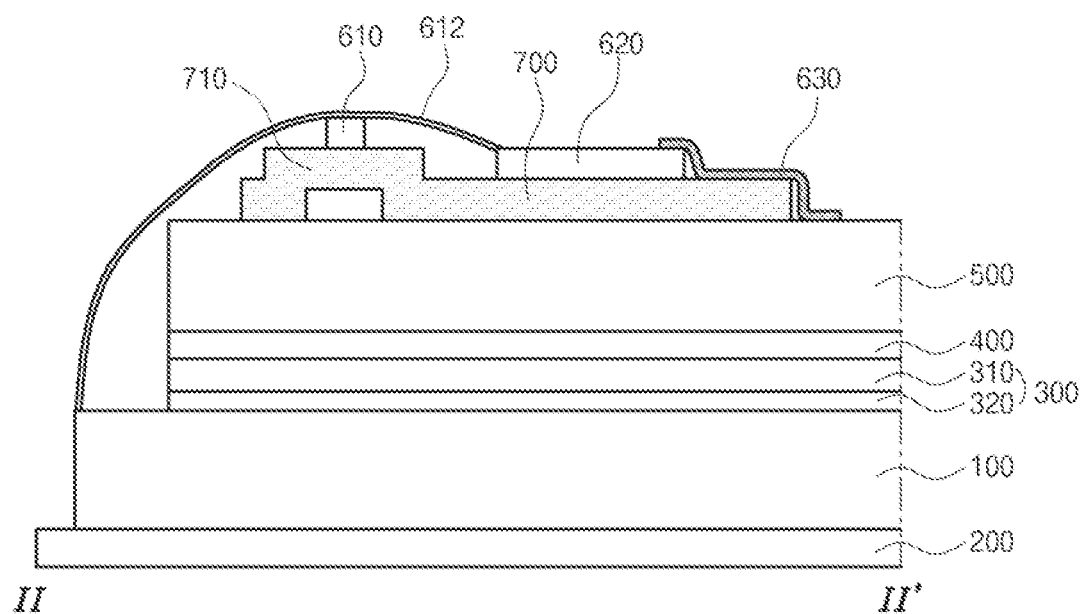
FIG. 7 is a cross-sectional view corresponding to the line II-IF of FIG. 6.

FIG. 6 is a schematic rear view of a display device according to the embodiment of the present disclosure, FIG. 7 is a cross-sectional view corresponding to the line II-IF of FIG. 6, and FIG. 1 will be referenced together. Here, FIG. 1 corresponds to the cross-section taken along the line I-I' of FIG. 6.

As shown in FIG. 6 and FIG. 7, the display device according to the embodiment of the present disclosure further includes at least one driver integrated circuit (D-IC) 610 and a source printed circuit board (S-PCB) 620 located on the rear surface of the heat dissipation plate 500 in order to drive the display panel 100.

The driver integrated circuit 610 is mounted on a surface of an intermediate member 612 such as a flexible printed circuit (FPC), tape, or film, which can be an inner surface facing the display panel 100, and the driver integrated circuit 610 is electrically connected to the display panel 100 and the source printed circuit board 620 through the intermediate member 612.

In the embodiment, four driver integrated circuits 610 are connected to the display panel 100 for example, but are not limited thereto. The number of driver integrated circuits 610 can be changed.

The source printed circuit board 620 is fixed to the heat dissipation plate 500 by a conductive tape 630, and an electrostatic discharge path is secured through the conductive tape 630.

Meanwhile, a buffer member 700 is provided between the driver integrated circuit 610 and the heat dissipation plate 500 and between the source printed circuit board 620 and the heat dissipation plate 500. For example, the buffer member 700 can have a thickness of about 0.15 mm to about 0.2 mm.

A first surface of the buffer member 700 can be in contact with the driver integrated circuit 610 and the source printed circuit board 620, and a second surface of the buffer member 700 can be in contact with the heat dissipation plate 500.

Here, the buffer member 700 has a protrusion 710 that is formed by being bent to correspond to the driver integrated circuit 610. Accordingly, the distance between the driver integrated circuit 610 and the heat dissipation plate 500 is greater than the distance between the source printed circuit board 620 and the heat dissipation plate 500. In addition, the distance between the driver integrated circuit 610 and the encapsulation film 300 is greater than the distance between the source printed circuit board 620 and the encapsulation film 300, and the distance between the driver integrated circuit 610 and the display panel 100 is greater than the distance between the source printed circuit board 620 and the display panel 100.

At this time, the protrusion 710 is bent and protrudes toward the driver integrated circuit 610 and is spaced apart from the heat dissipation plate 500. Therefore, the second surface of the buffer member 700 except for the protrusion 710 is in contact with the heat dissipation plate 500.

In general, since the driver integrated circuit 610 is vulnerable to stiffness, the driver integrated circuit 610 can be damaged when contacting a hard object. For example, in the present disclosure, the driver integrated circuit 610 can be damaged when contacting the encapsulation film 300 or the heat dissipation plate 500.

In addition, the driver integrated circuit 610 generates relatively a lot of heat. When the heat is transmitted to the encapsulation film 300, the encapsulation film 300 can be damaged. The damage of the encapsulation film 300 also affects the display panel 100, thereby lowering the image quality.

Accordingly, in the present disclosure, the protrusion 710 is provided in the buffer member 700 to serve as a damper, so that the driver integrated circuit 610 is prevented from being in contact with the encapsulation film 300 or the heat dissipation plate 500. Therefore, it is possible to prevent the damage of the driver integrated circuit 610 due to the contact with the encapsulation film 300 or the heat dissipation plate 500.

Further, the distance between the driver integrated circuit 610 and the encapsulation film 300 is increased by the protrusion 710, and the heat generated in the driver integrated circuit 610 is prevented from being transmitted to the encapsulation film 300. Accordingly, it is possible to prevent the damage of the encapsulation film 300 due to the heat generated in the driver integrated circuit 610.

It is preferable that the size of the protrusion 710 is greater than the size of the driver integrated circuit 610. In this case, the width of the protrusion 710 is greater than the width of the driver integrated circuit 610, and the length of the protrusion 710 is greater than the length of the driver integrated circuit 610.

The buffer member 700 can be formed of a formable material having elasticity. The buffer member 700 can be molded. Accordingly, the manufacturing process can be simplified, and an additional configuration is not needed, thereby decreasing the manufacturing costs.

For example, the buffer member 700 can be formed of polyethylene terephthalate (PET). However, the present disclosure is not limited thereto. Alternatively, the buffer member 700 can be formed of metal or polycarbonate (PC).

As described above, in the present disclosure, the buffer member 700 is configured to have the protrusion 710, so that the driver integrated circuit 610 can prevented from being in contact with the encapsulation film 300 or the heat dissipation plate 500, and the distance between the driver integrated circuit 610 and the encapsulation film 300 or the heat dissipation plate 500 can be increased. Therefore, it is possible to prevent the damage of the driver integrated circuit 610 due to the contact and the damage of the encapsulation film 300 due to the heat of the driver integrated circuit 610.

In the present disclosure, the heat dissipation plate is attached to the substantially entire surface of the display panel, so that the heat in the display panel can be rapidly discharged into the outside and the decrease of the image quality can be prevented.

In addition, the embossed patterns are provided at the surface of the adhesive layer on the display panel side, and the bubbles generated in attaching can be prevented or minimized, so that the local heat and the afterimages can be prevented. The luminance and image quality can be improved and the lifespan of the display device can be increased.

Further, the driver integrated circuit is prevented from being in contact with the encapsulation film or the heat dissipation plate due to the buffer member having the protrusion, so that and the distance between the driver integrated circuit and the encapsulation film or the heat dissipation plate can be increased. Therefore, it is possible to prevent the damage of the driver integrated circuit due to the contact and the damage of the encapsulation film due to the heat of the driver integrated circuit. Accordingly, the image quality of the display panel can be prevented from being lowered.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel;
   a heat dissipation plate having a top surface attached to a first surface of the display panel; and
   an adhesive layer between the display panel and the heat dissipation plate and directly contacting the heat dissipation plate,
   wherein the adhesive layer has a plurality of embossed patterns at a surface on a display panel side,
   wherein a thickness of the adhesive layer including the plurality of embossed patterns is greater than a distance between adjacent embossed patterns among the plurality of embossed patterns and smaller than a width of one of the plurality of embossed patterns, and
   wherein the adhesive layer includes a plurality of layers sequentially stacked between the display panel and the heat dissipation plate, and a total thickness of the plurality of layers is greater than the distance between adjacent embossed patterns among the plurality of embossed patterns and is smaller than the width of one of the plurality of embossed patterns.

2. The display device of claim 1, wherein the adhesive layer includes a first adhesive layer, a second adhesive layer, and a base layer between the first and second adhesive layers, and
   the first adhesive layer has the plurality of embossed patterns.

3. The display device of claim 2, wherein a height of one of the plurality of embossed patterns is smaller than a thickness of the first adhesive layer.

4. The display device of claim 2, wherein the total thickness of the plurality of layers is smaller than a thickness of the heat dissipation plate.

5. The display device of claim 2, wherein a thickness of the base layer is greater than a thickness of the second adhesive layer and is smaller than a thickness of the first adhesive layer.

6. The display device of claim 1, further comprising an encapsulation film between the display panel and the adhesive layer,
   wherein the encapsulation film is in contact with the plurality of embossed patterns.

7. The display device of claim 6, wherein the adhesive layer is disposed between the encapsulation film and the heat dissipation plate.

8. The display device of claim 1, further comprising a polarizing plate on a second surface of the display panel,
   wherein the display panel displays an image through the second surface of the display panel.

9. The display device of claim 1, wherein the heat dissipation plate is formed of aluminum.

10. The display device of claim 1, wherein a height of one of the plurality of embossed patterns is smaller than the distance between the adjacent embossed patterns among the plurality of embossed patterns.

11. A display device, comprising:
    a display panel;
    a heat dissipation plate having a top surface attached to a first surface of the display panel;
    an adhesive layer between the display panel and the heat dissipation plate;
    a source printed circuit board disposed under a bottom surface of the heat dissipation plate;
    a driver integrated circuit disposed under the bottom surface of the heat dissipation plate and electrically connected to the display panel and the source printed circuit board; and
    a buffer member between the driver integrated circuit and the heat dissipation plate, and between the source printed circuit board and the heat dissipation plate,
    wherein the adhesive layer has a plurality of embossed patterns at a surface on a display panel side,
    wherein the buffer member has a protrusion corresponding to the driver integrated circuit, and
    wherein a distance between the driver integrated circuit and the heat dissipation plate is greater than a distance between the source printed circuit board and the heat dissipation plate.

12. The display device of claim 11, wherein the buffer member is formed of a material having elasticity.

13. The display device of claim 12, wherein the buffer member is formed of polyethylene terephthalate, metal, or polycarbonate.

14. The display device of claim 11, wherein the width of the protrusion is greater than the width of the driver integrated circuit, and the length of the protrusion is greater than the length of the driver integrated circuit.

15. A display device, comprising:
    a display panel;
    a source printed circuit board disposed at a first surface of the display panel;
    a driver integrated circuit disposed at the first surface of the display panel and electrically connected to the display panel and the source printed circuit board; and a buffer member between the driver integrated circuit and the display panel, and between the source printed circuit board and the display panel, wherein the buffer member has a protrusion corresponding to the driver integrated circuit, and wherein a distance between the driver integrated circuit and the display panel is greater than a distance between the source printed circuit board and the display panel.

16. The display device of claim 15, wherein the buffer member is formed of a material having elasticity.

17. The display device of claim 16, wherein the buffer member is formed of polyethylene terephthalate, metal, or polycarbonate.

18. The display device of claim 15, further comprising an encapsulation film between the display panel and the buffer member.

19. The display device of claim 18, further comprising an adhesive layer and a heat dissipation plate between the encapsulation film and the buffer member, wherein the adhesive layer is disposed between the encapsulation film and the heat dissipation plate and has a plurality of embossed patterns at a surface on a display panel side.

20. The display device of claim 15, further comprising a polarizing plate on a second surface of the display panel, wherein the display panel displays an image through the second surface of the display panel.

21. The display device of claim 15, wherein the width of the protrusion is greater than the width of the driver integrated circuit, and the length of the protrusion is greater than the length of the driver integrated circuit.

\* \* \* \* \*